(12) United States Patent
Kim et al.

(10) Patent No.: US 6,690,115 B2
(45) Date of Patent: Feb. 10, 2004

(54) ELECTRO-LUMINESCENCE PANEL

(75) Inventors: Sung Ki Kim, Seoul (KR); Joon Kyu Park, Seoul (KR)

(73) Assignee: LG. Philips LCD Co., LTD, Seoul (KR)

(*) Notice: Subject to any disclaimer, the term of this patent is extended or adjusted under 35 U.S.C. 154(b) by 0 days.

(21) Appl. No.: 10/173,674

(22) Filed: Jun. 19, 2002

(65) Prior Publication Data

US 2002/0195967 A1 Dec. 26, 2002

(30) Foreign Application Priority Data

Jun. 22, 2001 (KR) ........................................ 2001-35662

(51) Int. Cl.[7] ................................................. G09G 3/10
(52) U.S. Cl. ................................ 315/169.1; 315/169.3; 345/204; 345/48; 345/76; 257/314; 257/368
(58) Field of Search .......................... 315/169.3, 169.1, 315/169.2; 345/44, 45, 48, 76, 77, 205, 55, 206, 204, 210, 690; 257/40, 57, 68, 70, 350, 627, 314–316, 368, 365, 366

(56) References Cited

U.S. PATENT DOCUMENTS

| | | | | |
|---|---|---|---|---|
| 6,268,842 B1 | * | 7/2001 | Yamazaki et al. | 345/98 |
| 6,303,963 B1 | * | 10/2001 | Ohtani et al. | 257/350 |
| 6,373,454 B1 | * | 4/2002 | Knapp et al. | 345/76 |
| 6,498,369 B1 | * | 12/2002 | Yamazaki et al. | 257/347 |
| 6,498,438 B1 | * | 12/2002 | Edwards | 315/169.3 |

* cited by examiner

*Primary Examiner*—Haissa Philogene
(74) *Attorney, Agent, or Firm*—McKenna Long & Aldridge LLP

(57) ABSTRACT

An electro-luminescence panel that is capable of improving picture quality. In the panel, first and second switches apply signals on data lines to capacitors in response to gate signals supplied via gate lines. The first and second switches have threshold voltages set to be different from each other. Accordingly, it becomes possible to prevent a kick-back phenomenon and minimize a leakage current, thereby improving picture quality.

24 Claims, 12 Drawing Sheets

ELECTRO-LUMINESCENCE PANEL

This application claims the benefit of Korean Patent Application No. 2001-35662, filed on Jun. 22, 2001, which is hereby incorporated by reference for all purposes as if fully set forth herein.

BACKGROUND OF THE INVENTION

1. Field of the Invention

This invention relates to an electro-luminescence display (ELD), and more particularly to an electro-luminescence panel that is capable of improving a picture quality.

2. Discussion of the Related Art

Recently, there have been developed various flat panel display devices reduced in weight and bulk that are capable of eliminating disadvantages associated with cathode ray tubes (CRTs). Such flat panel display devices include a liquid crystal display (LCD), a field emission display (FED), a plasma display panel (PDP) and an electro-luminescence (EL) panel, etc.

Studies for heightening a display quality of the flat panel display device and for providing the flat panel display with a large-scale screen have been actively made. The EL panel in such display devices is a self-emission device. The EL panel excites a fluorescent material using carriers such as electrons and holes, etc. to display a video image. The EL panel has advantages in that a low direct current voltage driving is possible and a response speed is fast.

As shown in FIG. 1, such an EL panel includes gate lines GL and data lines DL arranged in such a manner to cross each other, and pixel elements 108 arranged at crossings between the gate lines GL and the data lines DL. Each of the pixel elements 108 is driven when a gate signal on the gate line GL is enabled, thereby generating light corresponding to the amount of current of the pixel signal on the data line DL.

Further, the EL panel 104 includes current drivers 106 connected to the data lines DL. Each of the current drivers 106 control the current flowing from pixel elements 108, via the data line DL, into itself in response to a pixel signal, thereby applying the pixel signal to each pixel element 108. The current driver 106 allows electric charge current to flow in the pixel elements 108. A current signal which changes in accordance with the pixel signal flows in the pixel elements 108 with the aid of the current driver 106.

The gate lines GL of the EL panel 104 is connected to a gate driver 100 while the current drivers 106 are connected to the data driver 102. The gate driver 100 sequentially drives the gate lines GL. The data driver 102 applies pixel voltage signals for one line to the current drivers 106. Each of the current drivers 106 converts a pixel voltage signal from the data driver 102 into a backward pixel current signal, and applies the converted pixel current signal to the pixel element 108. In other words, the current driver 106 controls the amount of current on a current path going through the data line DL from the pixel element 108, thereby increasing a maximum amount of current at the pixel element 108 and a difference in the amount of current according to a gray scale level. As a result, the EL panel 104 is capable of displaying a gray scale picture.

Referring to FIG. 2, the pixel element 108 includes an EL cell (ELC) connected to a first low voltage line FVL, and an EL cell driving circuit 110 connected between the EL cell (ELC) and the data line DL. The first low voltage line FVL can be connected to a ground voltage source GND, or to the first low voltage source generating a negative voltage. The EL cell driving circuit 110 applies a forward current signal which changes in accordance with a backward amount of current on the data line DL to the EL cell (ELC) in a time interval when a gate signal on the gate line GL is enabled. To this end, the EL cell driving circuit 110 includes third and fourth PMOS TFTs Q3 and Q4 connected to form a current mirror among the EL cell (ELC), a first node N1 and a supply voltage line VDDL, and a capacitor C connected to a second node N2 to which gate electrodes of the third and fourth PMOS TFTs Q3 and Q4 are commonly connected and the supply voltage line VDDL.

The capacitor C charges a signal current on the data line DL when the supply voltage line VDDL is connected to the data line DL, and applies the charged signal current to the gate electrodes of the third and fourth PMOS TFTs Q3 and Q4. The third PMOS TFT Q3 is turned on by a signal current charged in the capacitor C, thereby applying a supply voltage VDD on the supply voltage line VDDL to the EL cell (ELC). At this time, the third PMOS TFT Q3 varies its channel width depending upon an amount of signal current charged in the capacitor C, thereby controlling the amount of current coupled from the supply voltage line VDDL to the EL cell (ELC). Then, the EL cell (ELC) generates light corresponding to the amount of current applied, via the third PMOS TFT Q3, from the supply voltage line VDDL. The fourth PMOS TFT Q4 also controls the current flowing from the supply voltage line VDDL into the data line DL to thereby determine the amount of current flowing into the EL cell (ELC) via the third PMOS TFT Q3.

Further, the EL cell driving circuit 110 includes first and second PMOS TFTs Q1 and Q2 which commonly respond to the gate signal on the gate line GL. The first PMOS TFT Q1 is turned on in a time interval when a low logic of gate signal is applied from the gate line GL, thereby connecting a source electrode of the first PMOS TFT Q1 connected to the first node N1 to the data line DL. In other words, the first PMOS TFT Q1 plays the role of forming a current path extending from the supply voltage line VDDL, via the fourth PMOS transistor Q4, the first node N1 and itself, into the data line DL in response to the low logic gate signal. The second PMOS TFT Q2 is also turned on in a time interval when the low logic gate signal from the gate line GL is applied to a gate electrode thereof, thereby connecting the gate electrodes of the third and fourth PMOS TFTs Q3 and Q4, via the second node N2 and the first node N1 connected to one terminal of the capacitor C, to the data line DL. In other words, the first and second PMOS TFTs Q1 and Q2 is turned on in a time interval when the gate signal on the gate line GL remains at a low logic to connect the data line DL to the supply voltage line VDDL as well as the second node N2, thereby charging a charge amount (or a signal current) corresponding to the amount of current flowing in the data line DL.

The first PMOS TFT Q1 of such an EL cell driving circuit 110 is turned on simultaneously with the second PMOS TFT Q2 having the same threshold voltage when the gate signal is changed from a low logic into a high logic. Thus, a kick-back phenomenon occurs in which a charge amount charged in the capacitor C is leaked at the falling edge of the gate signal. As a result, the EL cell (ELC) fails to accurately generate light corresponding to the amount of current on the data line DL, thereby causing picture deterioration or distortion.

SUMMARY OF THE INVENTION

Accordingly, the present invention is directed to an electro-luminescence pixel that substantially obviates one or more of the problems due to limitations and disadvantages of the related art.

An advantage of the present invention to provide an electro-luminescence panel that is capable of improving picture quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an electro-luminescence panel according to one embodiment of the present invention includes a plurality of gate lines; a plurality of data lines crossing the gate lines; a plurality of electro-luminescence cells arranged at crossings between the gate lines and the data lines; a plurality of capacitors for charging signals from the data lines; and first and second switches for applying signals on the data lines to the capacitors in response to gate signals supplied via the gate lines, said first and second switches having threshold voltages set to be different from each other.

In the electro-luminescence panel, the first switch has a gate terminal connected to the gate line, a source terminal connected to the data line and a drain terminal connected to a source terminal of the second switch.

The second switch has a gate terminal connected to the gate line, a source terminal connected to a drain terminal of the first switch and a drain terminal connected to the capacitor.

The threshold voltage of the first switch is set to be lower than that of the second switch.

A difference between the threshold voltage of the first switch and the threshold voltage of the second switch is more than about 0.5V.

The electro-luminescence panel further includes a third switch for applying signals on the data lines to the electro-luminescence cells in response to the signal current charged in the capacitor; and a fourth switch for controlling a current applied to each electro-luminescence cell.

The electro-luminescence panel further includes a third switch connected between the electro-luminescence cell and the capacitor; and a fourth switch connected to the third switch to form a current mirror.

Each of first to fourth switches includes a thin film transistor of same polarity channel.

First and second switches include thin film transistors having polarity channels different from each other, and third and fourth switches include thin film transistors having the same polarity channel.

A gate insulating film of the second switch has a larger thickness than a gate insulating film of the first switch.

A protective layer of the second switch has a larger thickness than a protective layer of the first switch.

An inter-layer insulating film of the second switch has a larger thickness than an inter-layer insulating film of the first switch.

A gate electrode of the second switch has a single-layer structure while a gate electrode of the first switch has a multi-layer structure.

Source and drain electrodes of the second switch have a single-layer structure while source and drain electrodes of the first switch have a multi-layer structure.

Source and drain electrodes of the second switch are made from a material different from those of the first switch.

A semiconductor layer of the second switch is made from a material different from that of the first switch.

A concentration of ions injected into a semiconductor layer of the second switch is set to be higher than a concentration of ions injected into a semiconductor layer of the first switch.

A semiconductor layer of the second switch includes hydrogen impurities.

A semiconductor layer of the second switch undergoes a surface treatment using plasma.

A lower substrate of the first switch has a crystallization direction different from that of the first switch.

A gate electrode of the second switch is made from a material different from that of the first switch.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
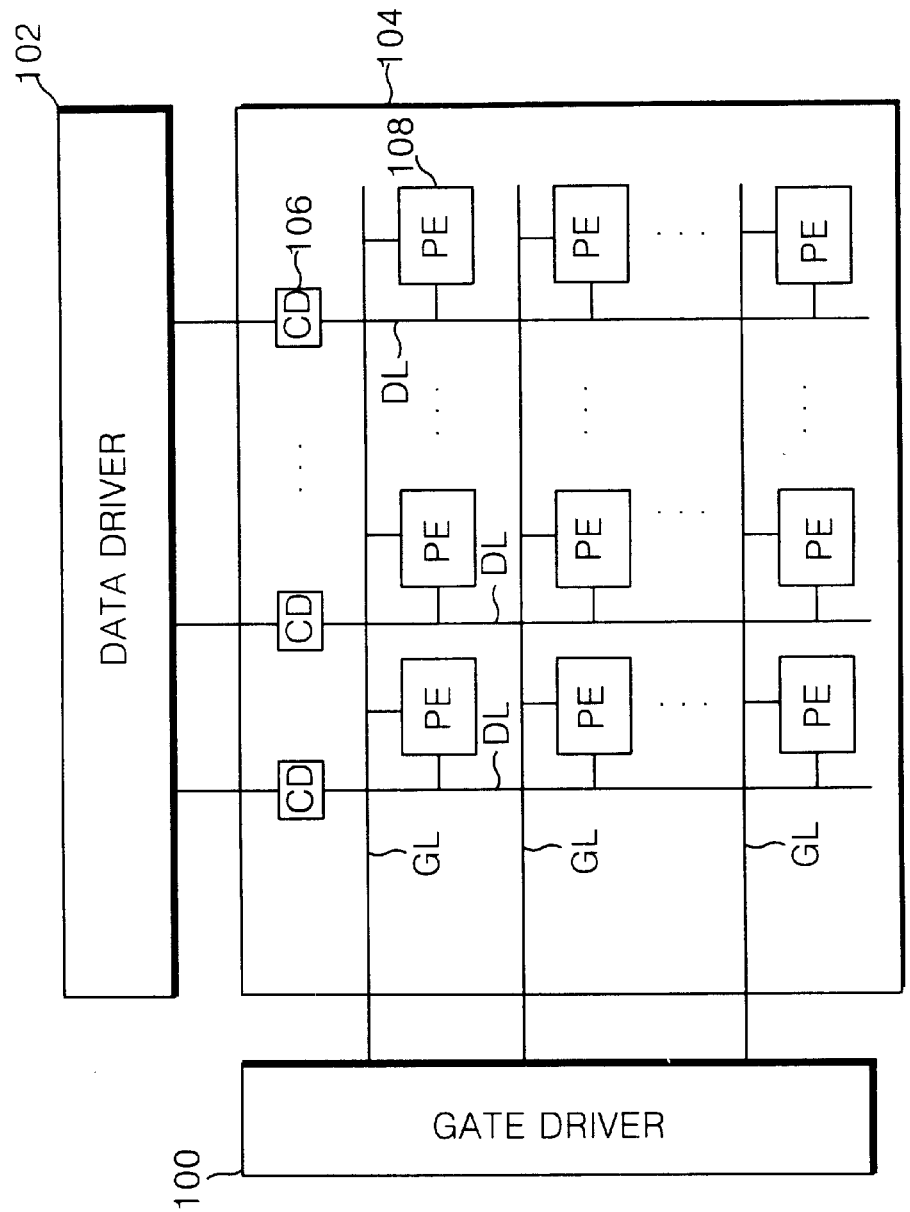
FIG. 1 is a schematic block diagram showing a configuration of a conventional electro-luminescence panel.
Figure 2:
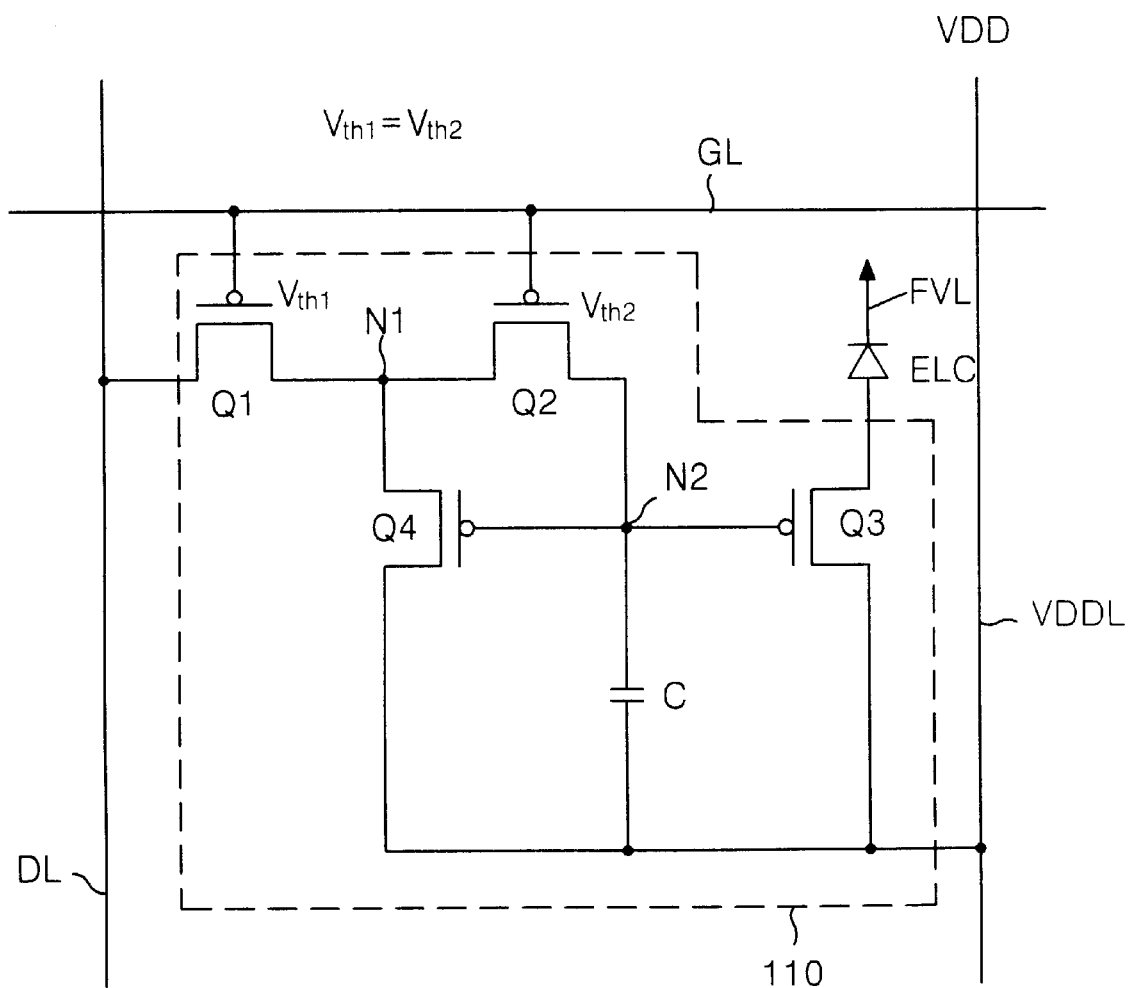
FIG. 2 is a detailed circuit diagram of the pixel element shown in FIG. 1.
Figure 3:
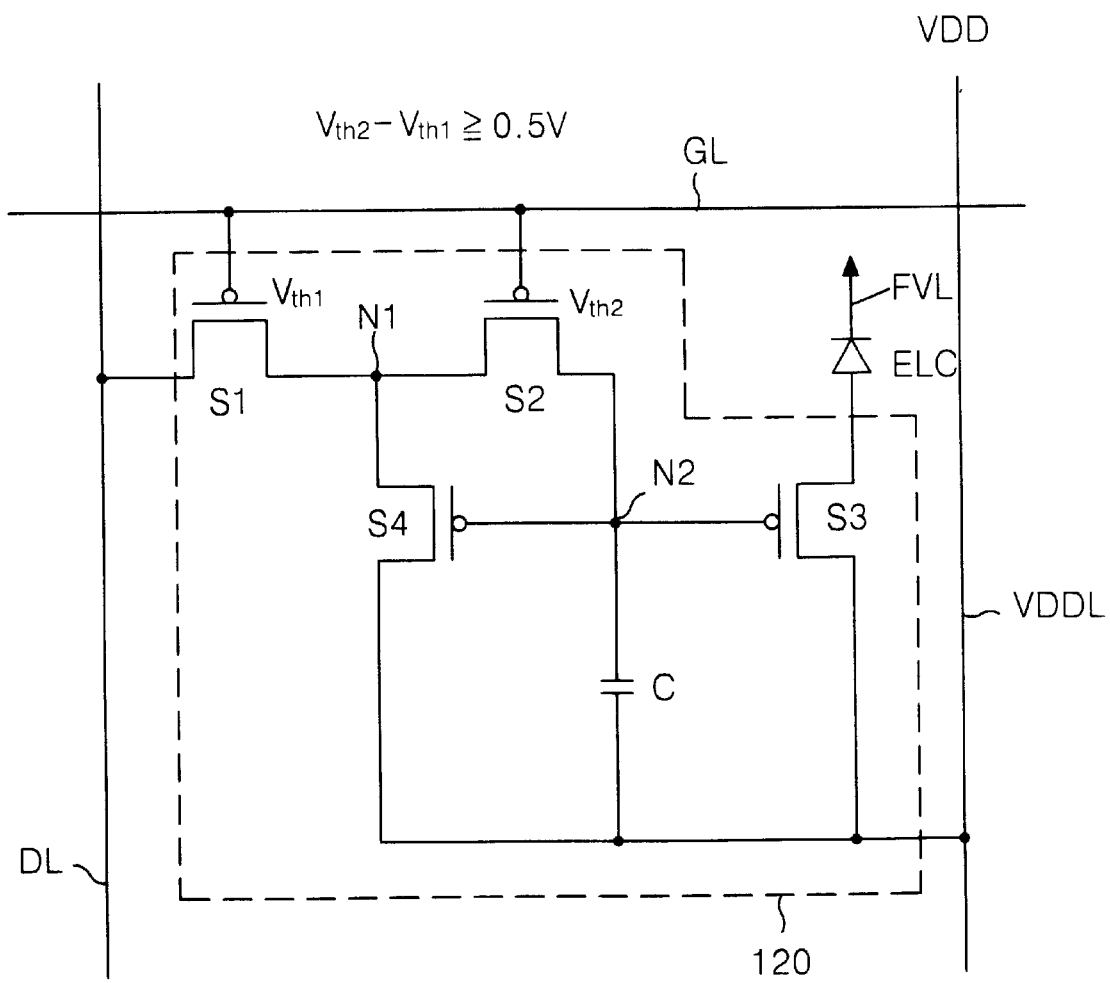
FIG. 3 is a detailed circuit diagram of a pixel element of an electro-luminescence panel according to an embodiment of the present invention.

Referring to FIG. 3, there is shown an EL cell driving circuit according to an embodiment of the present invention.

The EL cell driving circuit 120 includes third and fourth switches S3 and S4 connected in such a manner to form a current mirror among an EL cell (ELC), a first node N1 and a supply voltage line VDDL, a capacitor C connected between a second node N2 to which gate electrodes of the third and fourth switches S3 and S4 are commonly connected and the supply voltage line VDDL, a second switch S2 connected to the first node N1 and a gate line GL, and a first switch S1 connected between the first node N1 and a data line DL. Herein, each of the first to fourth switches S1 to S4 is made from a PMOS-type TFT.

The capacitor C charges a signal current on the data line DL when the supply voltage line VDDL is connected to the data line DL, and commonly applies the charged signal current to the gate electrodes of the third and fourth switches S3 and S4. The third switch S3 is turned on by a signal current charged in the capacitor C, thereby applying a supply voltage VDD on the supply voltage line VDDL to the EL cell (ELC). At this time, the third switch S3 varies its channel width depending upon the amount of signal current charged in the capacitor C, thereby controlling the amount of current coupled from the supply voltage line VDDL to the EL cell (ELC). Then, the EL cell (ELC) generates light corresponding to the amount of current applied, via the third switch S3, from the supply voltage line VDDL. The fourth switch S4 also controls the current flowing from the supply voltage line VDDL into the data line DL to thereby determine the amount of current flowing into the EL cell (ELC) via the third switch S3.

The first switch S1 is turned on in a time interval when a low logic of a gate signal is applied from the gate line GL, thereby connecting a source electrode of the first switch S1 connected to the first node N1 to the data line DL. In other words, the first switch S1 plays the role of forming a current path extending from the supply voltage line VDDL, via the fourth switch S4, the first node N1 and itself, into the data line DL in response to the low logic gate signal. The second switch S2 is also turned on in a time interval when the low logic gate signal from the gate line GL is applied to a gate electrode thereof, thereby connecting the gate electrodes of the third and fourth switches S3 and S4, via the second node N2 and the first node N1 connected to one terminal of the capacitor C, to the data line DL. In other words, the first and second switches S1 and S2 are turned on in a time interval when the gate signal on the gate line GL remains at a low logic to connect the data line DL to the supply voltage line VDDL as well as the second node N2, thereby charging a charge amount (or a signal current) corresponding to the amount of current flowing in the data line DL into the capacitor C.

This cell driving circuit 120 establishes threshold voltages Vth1 and Vth2 of the first and second switches S1 and S2 differently. In other words, the threshold voltage Vth1 of the first switch S1 is set to be lower than the threshold voltage Vth2 of the second switch S2 by a manufacturing method to be mentioned later. The most ideal condition is when a difference (Vth2–Vth1) between the threshold voltage Vth2 of the second switch S2 and the threshold voltage Vth1 of the first switch S1 is above about 0.5V. Such a first switch S1 is turned off later than the second switch S2 when the gate signal is changed from a low logic into a high logic. Thus, a charge amount charged in the capacitor C is not leaked at the falling edge of the gate signal. As a result, the EL cell (ELC) can accurately generate light corresponding to the amount of current on the data line DL, thereby displaying a picture corresponding to a video signal (or an image signal) of the EL panel without any deterioration or distortion.

Figure 4:
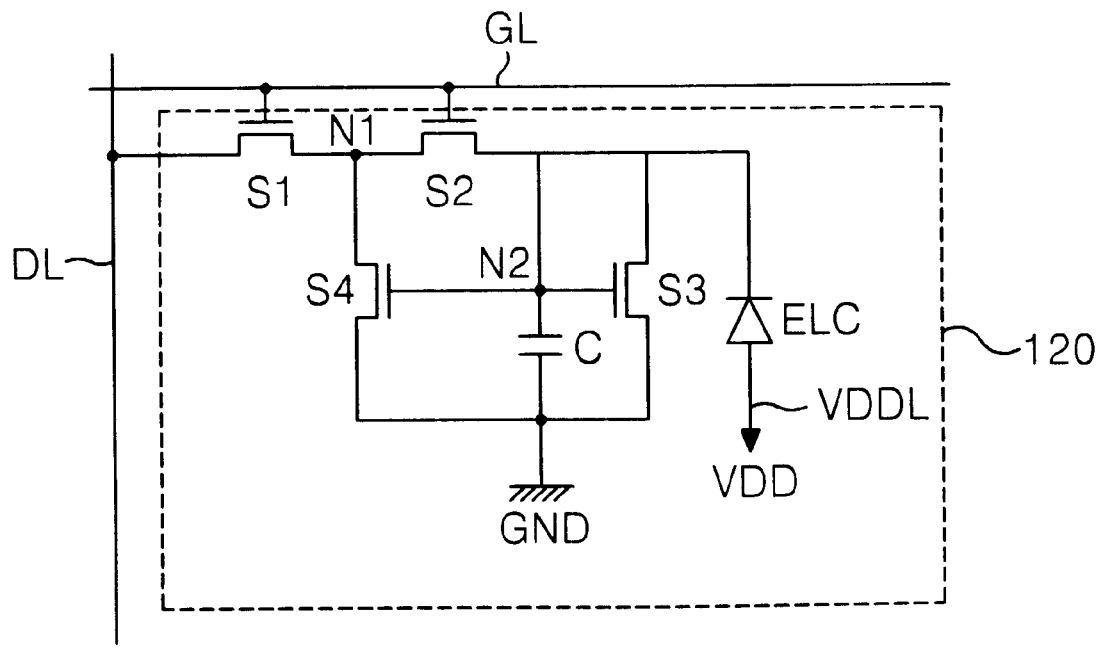
FIG. 4 is a detailed circuit diagram representing another switch example of the pixel element shown in FIG. 1.

Referring to FIG. 4, an EL cell driving circuit 120 according to another embodiment of the present invention includes third and fourth switches S3 and S4 connected in such a manner to form a current mirror among an EL cell (ELC), a first node N1 and a ground voltage GND, a capacitor C connected between a second node N2 to which gate electrodes of the third and fourth switches S3 and S4 are commonly connected and the supply voltage line VDDL, a second switch S2 connected to the first node N1 and a gate line GL, and a first switch S1 connected between the first node N1 and a data line DL. Herein, each of the first to fourth switches S1 to S4 is made from an NMOS-type TFT.

The capacitor C charges a signal current on the data line DL when the ground voltage GND is connected to the data line DL, and commonly applies the charged signal current to the gate electrodes of the third and fourth switches S3 and S4. The third switch S3 is turned on by a signal current charged in the capacitor C, thereby applying a ground voltage GND to the EL cell (ELC). At this time, the third switch S3 varies its channel width depending upon an amount of the signal current charged in the capacitor C, thereby controlling the amount of current coupled from the ground voltage GND to the EL cell (ELC). Then, the EL cell (ELC) generates light corresponding to the amount of current applied, via the third switch S3, from the ground voltage GND. The fourth switch S4 also controls the current flowing from the supply voltage line VDDL into the data line DL to thereby determine the amount of current amount flowing into the EL cell (ELC) via the third switch S3.

The first switch S1 is turned on in a time interval when a high logic of a gate signal is applied from the gate line GL, thereby connecting a source electrode of the first switch S1 connected to the first node N1 to the data line DL. In other words, the first switch S1 plays the role of forming a current path extending from a supply voltage line VDDL, via the fourth switch S4, the first node N1 and itself, into the data line DL in response to the low logic gate signal. The second switch S2 is also turned on in a time interval when the high logic gate signal from the gate line GL is applied to a gate electrode thereof, thereby connecting the gate electrodes of the third and fourth switches S3 and S4, via the second node N2 and the first node N1 connected to one terminal of the capacitor C, to the data line DL. In other words, the first and second switches S1 and S2 are turned on in a time interval when the gate signal on the gate line GL remains at a high logic to connect the data line DL to the ground voltage line GND as well as the second node N2, thereby charging a charge amount (or a signal current) corresponding to the amount of current flowing in the data line DL into the capacitor C.

This cell driving circuit 120 establishes threshold voltages Vth1 and Vth2 of the first and second switches S1 and S2 differently. In other words, the threshold voltage Vth1 of the first switch S1 is set to be lower than the threshold voltage Vth2 of the second switch S2 by a manufacturing method to be mentioned later. The most ideal condition is when a difference (Vth2–Vth1) between the threshold voltage Vth2 of the second switch S2 and the threshold voltage Vth1 of the first switch S1 is above about 0.5V. Such a first switch S1 is turned off later than the second switch S2 when the gate signal is changed from a low logic into a high logic. Thus, a charge amount charged in the capacitor C is not leaked at the falling edge of the gate signal. As a result, the EL cell (ELC) can accurately generate light corresponding to the amount of current on the data line DL, thereby displaying a picture corresponding to a video signal (or an image signal) of the EL panel without any deterioration or distortion.

The first to fourth switches S1 to S4 in the EL panel in accordance with the present invention are made from TFT of the same polarity channel, respectively, as shown in FIGS. 3 and 4. On the other hand, the first and second switches S1 and S2 can be replaced with thin film transistors having polarity channels different from each other. In this case, the third and fourth switches S3 and S4 are made from thin film transistors having the same polarity channel. Actually, if the first switch S1 is PMOS type TFT, the second switch S2 becomes of NMOS type TFT. Also, all of the third and fourth switches S3 and S4 become of PMOS type or NMOS type TFT.

FIGS. 5–13 are views representing a manufacturing process of the first and second switches having a different threshold voltage.

Figure 5:
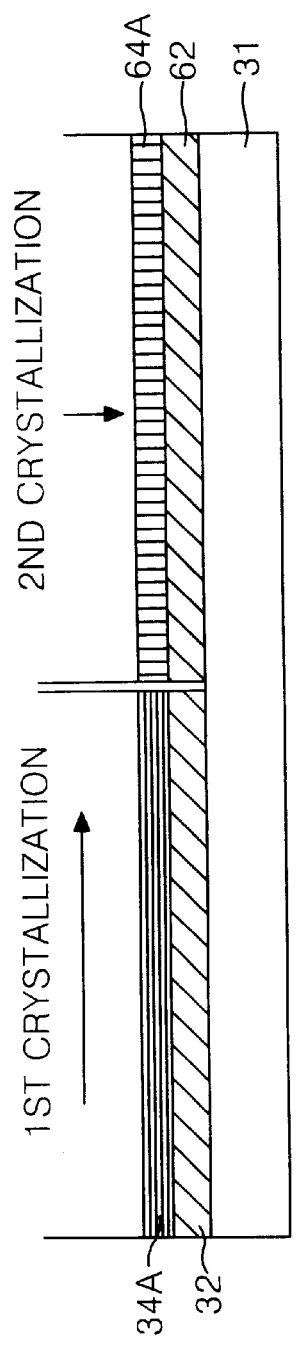
FIG. 5 is a sectional view of buffer insulating layers of the first and second switches shown in FIG. 3.

Referring to FIG. 5, first and second buffer insulating films 32 and 62 of the first and second switches S1 and S2 are formed on a substrate 31. The first and second buffer insulating films 32 and 62 are made by depositing an insulating material such as silicon oxide ($SiO_2$) onto the substrate 31.

Subsequently, an amorphous silicon thin film is formed on the first and second buffer insulating films 32 and 62. This amorphous silicon thin film is crystallized by a sequential lateral solidification (SLS) technique. Accordingly, first and second SLS silicon films 34A and 64A are provided in which silicon grains are dramatically grown. The first SLS silicon film 34A provided on the first buffer insulating film 32 is formed in the horizontal direction while the second SLS silicon film 64A provided on the second buffer insulating film 62 is formed in the vertical direction.

Figure 6:
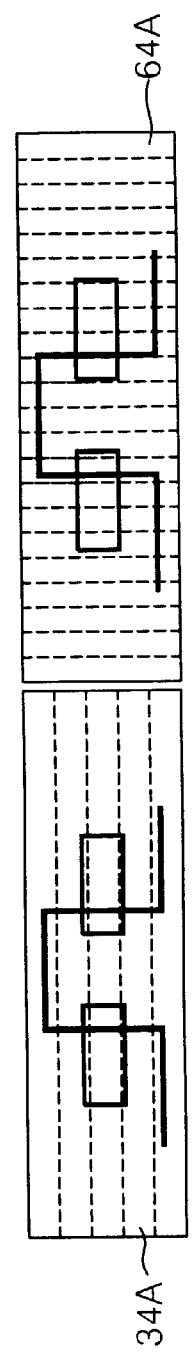
FIG. 6 is a detailed view of the buffer insulating layers shown in FIG. 5.

Source and drain electrodes provided on the first SLS silicon film 34A in the horizontal direction later have a state crystallized in the same direction as the first SLS silicon film 34A as shown in FIG. 6. Accordingly, a mobility of electrons is raised to increase an on-current. Owing to the increased on-current, the threshold voltage Vth1 of the first switch S1 is relatively lower. On the other hand, source and drain electrodes provided on the second SLS silicon film 64A in the vertical direction are crystallized in a direction perpendicular to the second SLS silicon film 64A, so that a mobility of electrons is lowered to reduce an on-current. Owing to the reduced on-current, the threshold voltage Vth2 of the second switch S2 is relatively higher.

Figure 7:
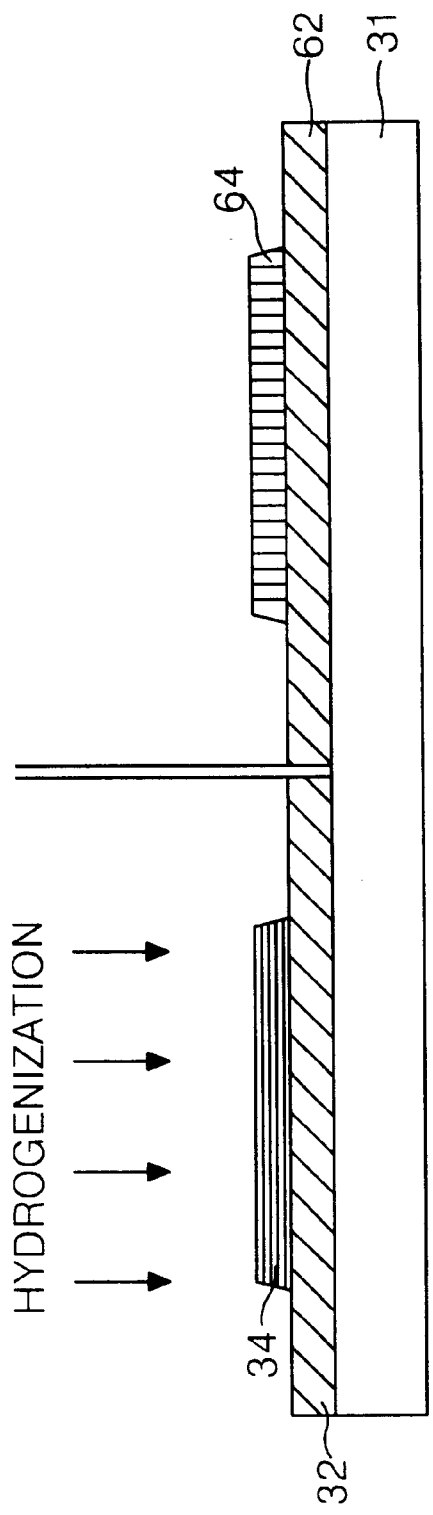
FIG. 7 is a sectional view of active layers of the first and second switches shown in FIG. 3.

Referring to FIG. 7, the first and second active layers 34 and 64 are formed on the first and second buffer layers 32 and 62. The first and second active layers 34 and 64 are formed by patterning the first and second silicon films 34A and 64A.

Polycrystalline silicon for making the first and second active layers 34 and 64 has four electrons, any one of which have a dangling bond failing to be bound with ambient atoms. In order to reduce this dangling bond, the first active layer 34 is hydrogenized. Owing to this hydrogenization process, the dangling bond of the first active layer 34 is reduced to improve a binding force with respect to the ambient atoms. Accordingly, an electrical characteristic is enhanced, so that the threshold voltage Vth1 of the first switch S1 is set to be relatively lower than the second threshold voltage Vth2 of the second switch S2.

Alternatively, the second active layer 64 and the first active layer 34 are made from amorphous silicon having a different component. An amount of defects contained in the amorphous silicon making the second active layer 64 is greater than that of the first active layer 34. Accordingly, the threshold voltage Vth2 of the second switch S2 is set to be relatively higher than the threshold voltage Vth2 of the first switch S1.

Additionally, the surface of the first active layer 34 is subjected to a plasma treatment to thereby form the surface of the first active layer 34 relatively rough. Accordingly, an electron structure within the first active layer 34 having the roughened surface becomes different, so that the threshold voltage Vth1 of the first switch S1 is set to be relatively lower than the threshold voltage Vth2 of the second switch S2.

Figure 8:
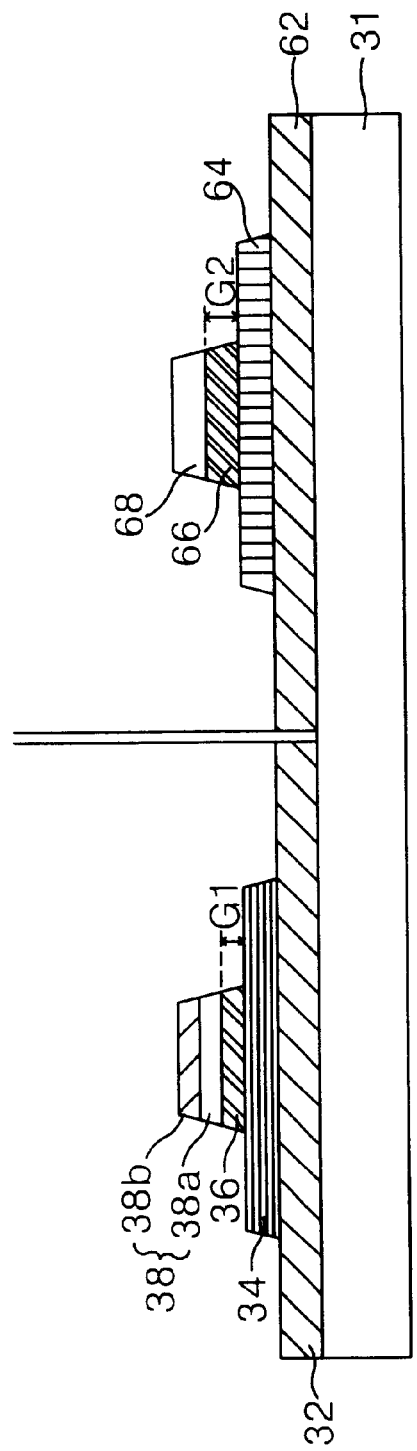
FIG. 8 is a sectional view of gate electrodes and gate lines of the first and second switches shown in FIG. 3.

Referring to FIG. 8, the first and second gate insulating films 36 and 66 and the first and second electrodes 38 and 68 are provided at the upper portion of the first and second buffer insulating films 32 and 62.

The first and second gate insulating films 36 and 66 and the first and second gate electrodes 38 and 68 are formed by sequentially depositing an insulating material and a metal layer onto the first and second buffer insulating films 32 and 62 and then patterning them. A thickness G2 of the second gate insulating film 66 is set to be larger than a thickness G1 of the first gate insulating film 36. In other words, an amount of defects contained in the second gate insulating film 66 becomes greater than that contained in the first gate insulating film 36. Accordingly, a gate voltage corresponding to the second gate insulating film 66 is increased, so that the threshold voltage Vth2 of the second switch S2 is set to be relatively higher than the threshold voltage Vth1 of the first switch S1.

Alternatively, the first gate electrode 38 has a multi-layer structure while the second gate electrode 68 has a single-layer structure. The first gate electrode 38 is formed from first and second metal layers 38a and 38b while the second gate electrode 68 is formed from any one metal layer of the first and second metal layers 38a and 38b. The first gate electrode 38 with a multi-layer structure has a relatively higher conductivity than the second gate electrode 68 with a single-layer structure. In other words, a voltage of the second gate electrode 68 is increased, so that the threshold voltage Vth2 of the second switch S2 is set to be relatively higher than the threshold voltage Vth1 of the first switch S1.

Otherwise, the first gate electrode 38 and the second gate electrode 68 are made from different metal materials. Since band characteristics of the first and second switches S1 and S2 become different depending upon a type of metal, the threshold voltage Vth2 of the second switch S2 becomes different from the threshold voltage Vth1 of the first switch S1.

Figure 9:
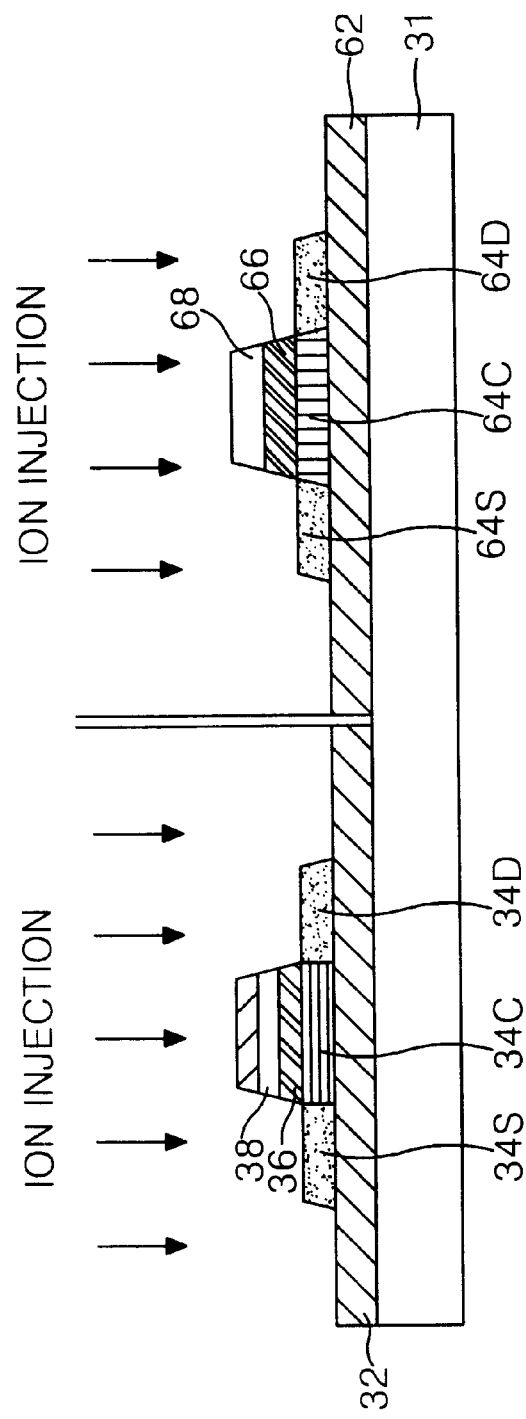
FIG. 9 is a sectional view showing an ion injection process at the first and second switches in FIG. 3.

Referring to FIG. 9, first source and drain areas 34S and 34D are provided on the first buffer insulating layer 32 while second source and drain areas 64S and 64D are provided on the second buffer insulating layer 62.

The first source and drain areas 34S and 34D are formed by injecting $n^+$ ions into each side of the exposed first active layer 34 and irradiating laser beams thereon to activate defects. The second source and drain areas 64S and 64D are formed by injecting $n^+$ ions into each side of the exposed second active layer 64 and irradiating laser beams thereon to activate defects.

If an ion concentration injected into the second active layer 64 is higher than an ion concentration injected into the first active layer 34, then the threshold voltage Vth1 of the first switch S1 is set to be relatively lower than the threshold voltage Vth2 of the second switch S2.

Figure 10:
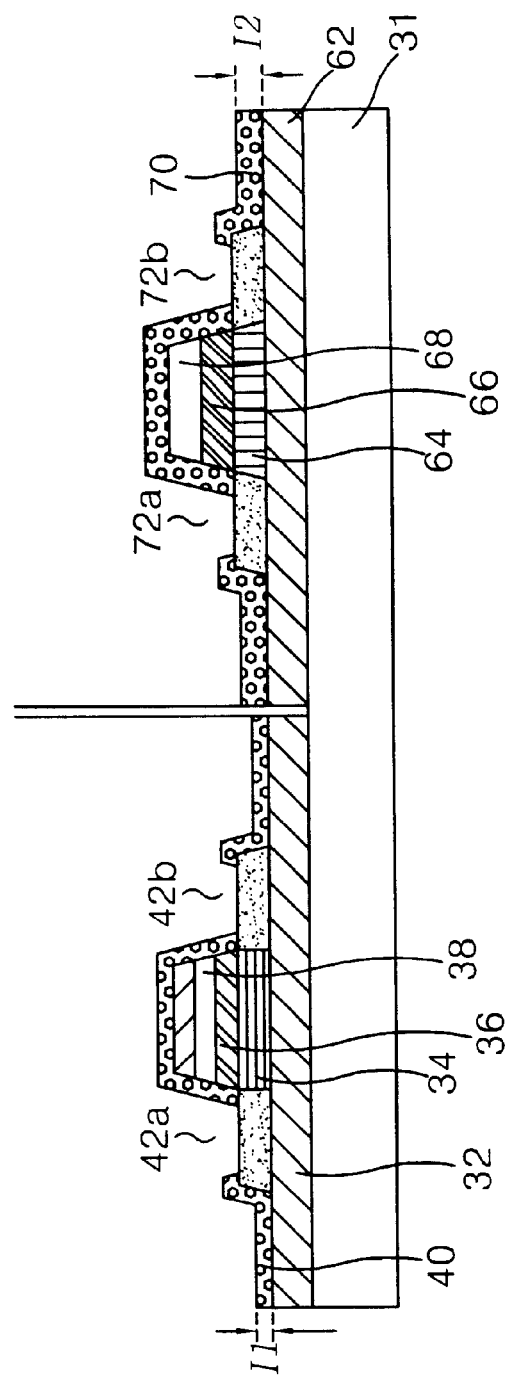
FIG. 10 is a sectional view of interlayer insulating films of the first and second switches shown in FIG. 3.

Referring to FIG. 10, the first and second inter-layer insulating films 40 and 70 are provided on the substrate 31.

The first inter-layer insulating film 40 is formed by depositing an insulating material onto the substrate 31 in such a manner to cover the first gate electrode 38 and the first active layer 34. The second inter-layer insulating film 70 is formed by depositing an insulating material onto the substrate 31 in such a manner to cover the second gate electrode 68 and the second active layer 64.

A thickness I2 of the second inter-layer insulating film 70 is set to be larger than a thickness I1 of the first inter-layer insulating film 40. An amount of defects contained in the second inter-layer insulating film 70 becomes greater than that in the first inter-layer insulating film 40. Accordingly, a gate voltage of the second switch S2 corresponding to the second inter-layer insulating film 70 is increased, so that the threshold voltage Vth2 of the second switch S2 is set to be relatively higher than the threshold voltage Vth1 of the first switch S1.

First and second contact holes 42a, 42b, 72a and 72b are defined in the first and second inter-layer insulating films 40 and 70. The first contact holes 42a and 42b consists of a source contact hole 42a in which a defect area used as a source area is exposed, and a drain contact hole 42b in which a defect area used as a drain area is exposed. The second contact holes 72a and 72b consists of a source contact hole 72a in which a defect area used as a source area is exposed, and a drain contact hole 72b in which a defect area used as a drain area is exposed.

Figure 11:
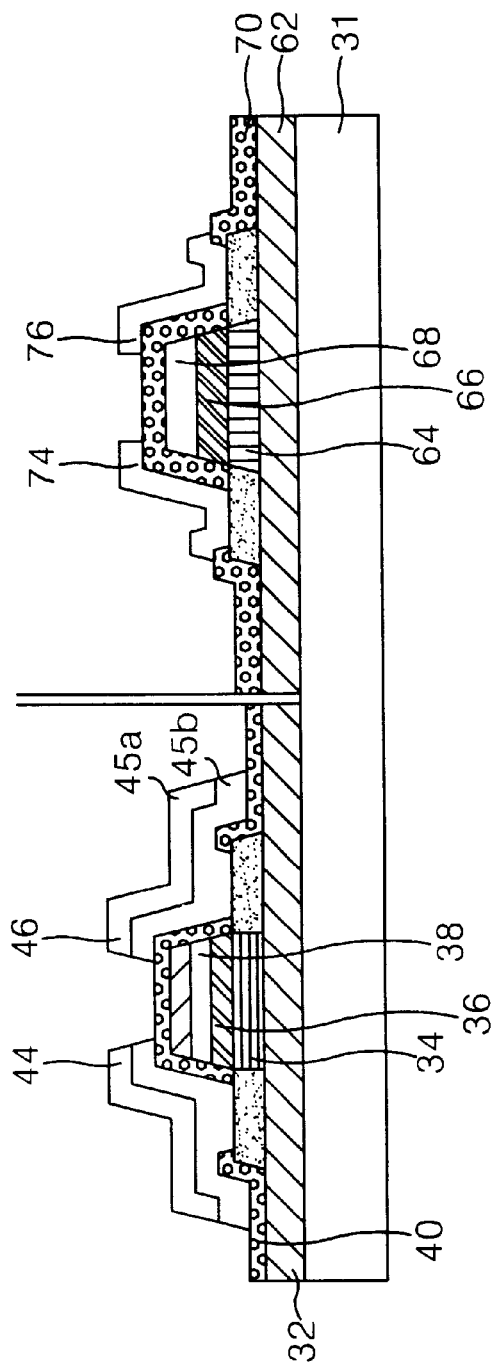
FIG. 11 is a sectional view of source and drain electrodes of the first and second switches shown in FIG. 3.

Referring to FIG. 11, first source and drain electrodes 44 and 46 are provided on the first inter-layer insulating film 40 while second source and drain electrodes 74 and 76 are provided on the second inter-layer insulating film 70.

The first source and drain electrodes 44 and 46 are formed by depositing a metal layer onto the first inter-layer insulating film 40 and then patterning it, whereas the second source and drain electrodes 74 and 76 are formed by depositing a metal layer onto the second inter-layer insulating film 70 and then patterning it. The first source and drain electrodes 44 and 46 are electrically connected, via the first contact holes 42a and 42b, to the source and drain areas 34S and 34D of the first active layer 34, respectively. The second source and drain electrodes 74 and 76 are electrically connected, via the second contact holes 72a and 72b, to the source and drain areas 64S and 64D of the second active layer 64, respectively.

Each of the second source and drain electrodes 74 and 76 has a single-layer structure while each of the first source and drain electrodes 44 and 46 has a multi-layer structure. The first source and drain electrodes 44 and 46 with a multi-layer structure are formed from first and second metal layers 45a and 45b. The second source and drain electrodes 74 and 76 are formed from any one of the first and second metal layers 45a and 45b. Accordingly, the second source and drain electrodes 74 and 76 has a relatively lower conductivity than the first source and drain electrodes 44 and 46, respectively. In other words, a gate voltage of the second switch S2 is increased, so that the threshold voltage of the second switch S2 is set to be higher than the threshold voltage Vth1 of the first switch S1.

Figure 12:
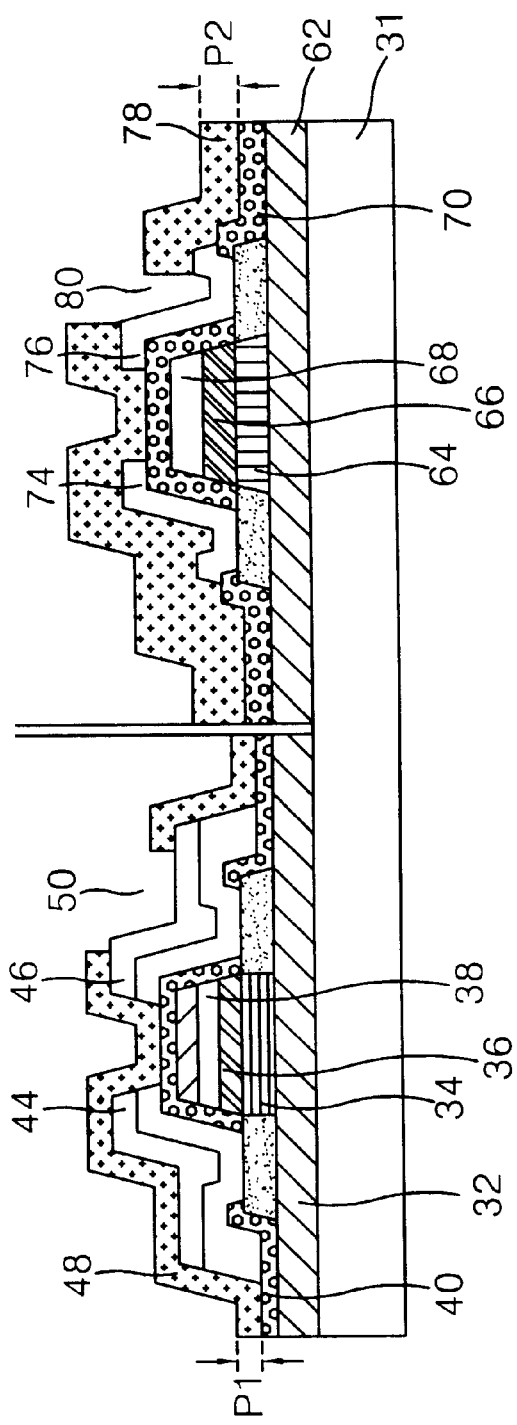
FIG. 12 is a sectional view of protective layers of the first and second switches shown in FIG. 3.

Referring to FIG. 12, first and second protective layers 48 and 78 are provided on the first and second inter-layer insulating films 40 and 70, respectively.

The first protective layer 48 is formed by depositing an insulating material such as silicon oxide (SiO$_2$) in such a manner to cover the first source and drain electrodes 44 and 46. The second protective layer 78 is formed by depositing an insulating material such as silicon oxide (SiO$_2$) in such a manner to cover the second source and drain electrodes 74 and 76.

A thickness P2 of the second protective layer 78 is set to be larger than a thickness P1 of the first protective layer 48. In other words, an amount of defects contained in the second protective layer 78 becomes greater than that in the first protective layer 48. Accordingly, a gate voltage of the second switch S2 corresponding to the second protective layer 78 is increased, so that the threshold voltage Vth2 of the second switch S2 is set to be higher than the threshold voltage Vth1 of the first switch S1.

Third and fourth contact holes 50 and 80 are defined in the first and second protective layers 48 and 78. The third contact hole 50 passes through the first protective layer 48 to expose the surface of the first drain electrode 46. The fourth contact hole 80 passes through the second protective layer 78 to expose the surface of the second drain electrode 76.

Figure 13:
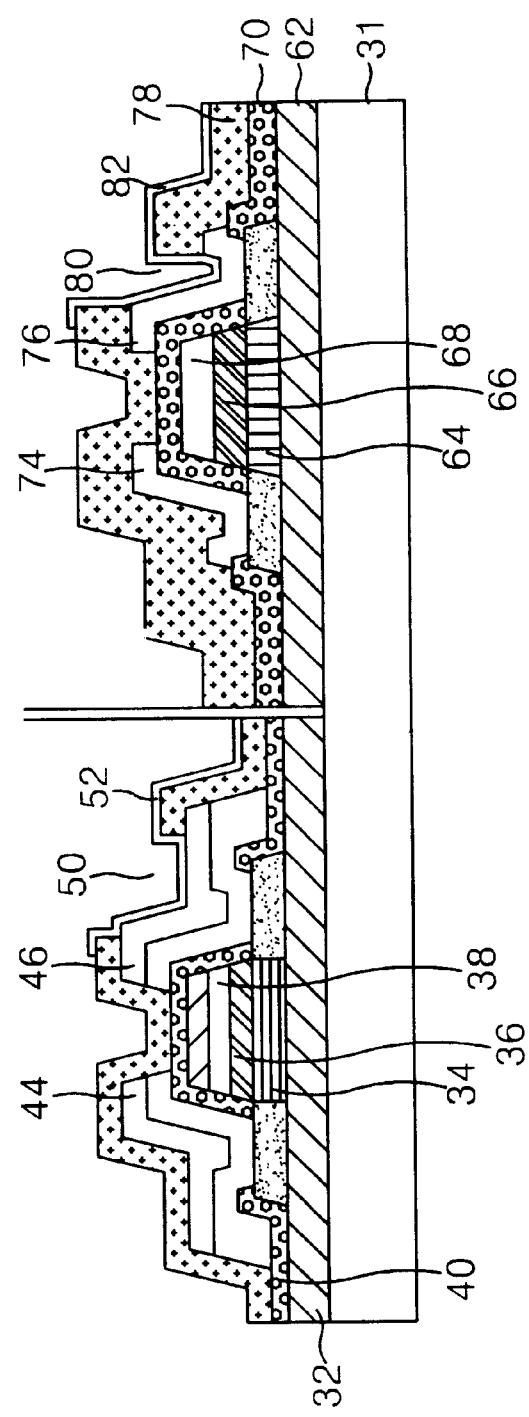
FIG. 13 is a sectional view of pixel electrodes of the first and second switches shown in FIG. 3.

Referring to FIG. 13, first and second transparent electrodes 52 and 82 are provided on the first and second protective layers 48 and 78, respectively.

The first and second transparent electrodes 52 and 82 are formed by depositing a transparent conductive material onto the first and second protective layers 48 and 78 and then patterning them. The first transparent electrode 52 is in electrical contact with the first drain electrode 46 via the third contact hole 50, whereas the second transparent electrode 82 is in electrical contact with the second drain electrode 76 via the fourth contact hole 80.

The first and second transparent electrodes 52 and 82 are made from any one of indium-tin-oxide (ITO), indium-zinc-oxide (IZO) and indium-tin-zinc-oxide (ITZO).

The first and second switches S1 and S2 made by any one of various methods suggested in FIG. 5 to FIG. 12 have threshold voltages Vth1 and Vth2 different from each other to reduce a kick-back phenomenon.

As described above, according to the present invention, the threshold voltages of the first and second switches are set to be different from each other. Accordingly, it becomes possible to prevent a kick-back phenomenon and minimize a leakage current, thereby improving picture quality.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electro-luminescence panel comprising:
   a plurality of gate lines;
   a plurality of data lines crossing the gate lines;
   a plurality of electro-luminescence cells arranged at intersections between the gate lines and the data lines;
   a plurality of capacitors for charging signals from the data lines; and
   first and second switches in each electro-luminescence cell for applying signals on each data line to the capacitors in response to gate signals supplied via each gate line, said first and second switches having threshold voltages set to be different from each other.

2. The electro-luminescence panel according to claim 1, wherein said first switch has a gate terminal connected to the gate line, a source terminal connected to the data line and a drain terminal connected to a source terminal of the second switch.

3. The electro-luminescence panel according to claim 1, wherein said second switch has a gate terminal connected to the gate line, a source terminal connected to a drain terminal of the first switch and a drain terminal connected to the capacitor.

4. The electro-luminescence panel according to claim 1, wherein said threshold voltage of the first switch is set to be lower than that of the second switch.

5. The electro-luminescence panel according to claim 1, wherein a difference between the threshold voltage of the first switch and the threshold voltage of the second switch is more than about 0.5V.

6. The electro-luminescence panel according to claim 1, further comprising:
   a third switch for applying signals on the data lines to the electro-luminescence cells in response to said signal current charged in the capacitor; and
   a fourth switch for controlling a current applied to each electro-luminescence cell.

7. The electro-luminescence panel according to claim 1, further comprising:
   a third switch connected between the electro-luminescence cell and the capacitor; and
   a fourth switch connected to the third switch to form a current mirror.

8. The electro-luminescence panel according to claim 7, wherein each of said first to fourth switches includes a thin film transistor of a same polarity channel.

9. The electro-luminescence panel according to claim 7, wherein said first and second switches includes thin film transistors having polarity channels different from each other and said third and fourth switches includes thin film transistors having the same polarity channel.

10. The electro-luminescence panel according to claim 1, wherein a gate insulating film of the second switch has a larger thickness than a gate insulating film of the first switch.

11. The electro-luminescence panel according to claim 1, wherein a protective layer of the second switch has a larger thickness than a protective layer of the first switch.

12. The electro-luminescence panel according to claim 1, wherein an inter-layer insulating film of the second switch has a larger thickness than an inter-layer insulating film of the first switch.

13. The electro-luminescence panel according to claim 1, wherein a gate electrode of the second switch has a single-layer structure while a gate electrode of the first switch has a multi-layer structure.

14. The electro-luminescence panel according to claim 1, wherein source and drain electrodes of the second switch have a single-layer structure while source and drain electrodes of the first switch have a multi-layer structure.

15. The electro-luminescence panel according to claim 1, wherein source and drain electrodes of the second switch are made from a material different from those of the first switch.

16. The electro-luminescence panel according to claim 1, wherein a semiconductor layer of the second switch is made from a material different from that of the first switch.

17. The electro-luminescence panel according to claim 1, wherein a concentration of ions injected into a semiconductor layer of the second switch is set to be higher than a concentration of ions injected into a semiconductor layer of the first switch.

18. The electro-luminescence panel according to claim 1, wherein a semiconductor layer of the second switch includes hydrogen impurities.

19. The electro-luminescence panel according to claim 1, wherein a semiconductor layer of the second switch undergoes a surface treatment using plasma.

20. The electro-luminescence panel according to claim 1, wherein a lower substrate of the first switch has a crystallization direction different from that of the first switch.

21. The electro-luminescence panel according to claim 1, wherein a gate electrode of the second switch is made from a material different from that of the first switch.

22. An electro-luminescence panel comprising:
   a plurality of gate lines;
   a plurality of data lines crossing the gate lines;
   a plurality of electro-luminescence cells arranged at intersections between the gate lines and the data lines;
   a plurality of capacitors for charging signals from the data lines; and
   first and second switches in each electro-luminescence cell being turned-on in response to a gate signal supplied via each gate line to apply signals on each data line to the capacitors, said first and second switches having a different turn-on interval from each other.

23. The electro-luminescence panel according to claim 22, wherein the second switch has a longer turn-on interval than the first switch.

24. The electro-luminescence panel according to claim 22, further comprising:
   a third switch connected between the electro-luminescence cell and the capacitor; and
   a fourth switch connected to the third switch to form a current mirror.

* * * * *